(12) United States Patent
Yoon et al.

(10) Patent No.: US 11,990,590 B2
(45) Date of Patent: May 21, 2024

(54) BATTERY MANAGEMENT APPARATUS AND METHOD

(71) Applicant: LG ENERGY SOLUTION, LTD., Seoul (KR)

(72) Inventors: Du-Seong Yoon, Daejeon (KR); Dong-Wook Koh, Daejeon (KR); Jin-Hyung Lim, Daejeon (KR); Gwang-Hoon Jun, Daejeon (KR); Jeong-Mi Choi, Daejeon (KR); Yoon-Jung Bae, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/019,401

(22) PCT Filed: Jun. 3, 2021

(86) PCT No.: PCT/KR2021/006977
§ 371 (c)(1),
(2) Date: Feb. 2, 2023

(87) PCT Pub. No.: WO2022/035032
PCT Pub. Date: Feb. 17, 2022

(65) Prior Publication Data
US 2023/0207910 A1 Jun. 29, 2023

(30) Foreign Application Priority Data
Aug. 14, 2020 (KR) .................. 10-2020-0102644

(51) Int. Cl.
*H01M 10/48* (2006.01)
*H01M 10/42* (2006.01)

(52) U.S. Cl.
CPC ......... *H01M 10/48* (2013.01); *H01M 10/425* (2013.01); *H01M 2010/4271* (2013.01); *H01M 2010/4278* (2013.01)

(58) Field of Classification Search
CPC ............... H01M 10/48; H01M 10/425; H01M 2010/4271; H01M 2010/4278
(Continued)

(56) References Cited

U.S. PATENT DOCUMENTS 8,680,815 B2 3/2014 Wang et al.
10,353,009 B2 7/2019 Torai et al.
(Continued)

FOREIGN PATENT DOCUMENTS

JP 5445505 B2 3/2014
JP 2014-092471 A 5/2014
(Continued)

OTHER PUBLICATIONS

Extended European Search Report dated Aug. 30, 2023 for counterpart European Patent Application 21856039.9.
(Continued)

*Primary Examiner* — Vincent Q Nguyen
(74) *Attorney, Agent, or Firm* — Morgan, Lewis & Bockius LLP

(57) ABSTRACT

A battery management apparatus and method according to an embodiment of the present disclosure is directed to obtaining a positive electrode profile and a negative electrode profile for a battery cell in a non-destructive manner by appropriately adjusting a preset negative electrode profile. According to one aspect of the present disclosure, by using the battery profile and the adjusted negative electrode profile for the degraded battery cell, there is an advantage that the positive electrode profile of the degraded battery cell may be easily estimated in a non-destructive manner.

17 Claims, 7 Drawing Sheets

(58) Field of Classification Search
USPC .......................................... 324/426, 432–435
See application file for complete search history.

(56) References Cited

U.S. PATENT DOCUMENTS

| | | |
|---|---|---|
| 2012/0249082 A1 | 10/2012 | Yamamoto et al. |
| 2013/0314050 A1 | 11/2013 | Matsubara et al. |
| 2013/0335009 A1 | 12/2013 | Katsumata et al. |
| 2016/0061908 A1 | 3/2016 | Torai et al. |
| 2017/0030974 A1 | 2/2017 | Becker et al. |
| 2017/0146609 A1 | 5/2017 | Uchino et al. |
| 2017/0146610 A1 | 5/2017 | Cha et al. |
| 2017/0212170 A1 | 7/2017 | Torai et al. |
| 2018/0233786 A1 | 8/2018 | Schwichtenhövel et al. |
| 2020/0150183 A1* | 5/2020 | Yoon .................... G01R 31/374 |
| 2020/0393518 A1 | 12/2020 | Takegami et al. |
| 2021/0167432 A1 | 6/2021 | Han et al. |

FOREIGN PATENT DOCUMENTS

| | | |
|---|---|---|
| JP | 2015-230193 A | 12/2015 |
| JP | 2016-207287 A | 12/2016 |
| JP | 6123844 B2 | 5/2017 |
| JP | 6380417 B2 | 8/2018 |
| JP | 2019-045351 A | 3/2019 |
| KR | 10-2013-0142884 A | 12/2013 |
| KR | 10-1504804 B1 | 3/2015 |
| KR | 10-1696313 B1 | 1/2017 |
| KR | 10-1992047 B1 | 6/2019 |
| KR | 10-2020-0018308 A | 2/2020 |
| WO | WO2019/202752 A1 | 10/2019 |

OTHER PUBLICATIONS

International Search Report (with partial translation) and Written Opinion dated Sep. 23, 2021, for corresponding International Patent Application No. PCT/KR2021/006977.

* cited by examiner

BATTERY MANAGEMENT APPARATUS AND METHOD

TECHNICAL FIELD

The present application claims priority to Korean Patent Application No. 10-2020-0102644 filed on Aug. 14, 2020, in the Republic of Korea, the disclosures of which are incorporated herein by reference.

The present disclosure relates to a battery management apparatus and method, and more particularly, to a battery management apparatus and method for generating a positive electrode profile for a battery cell in a non-destructive manner.

BACKGROUND ART

Recently, the demand for portable electronic products such as notebook computers, video cameras and portable telephones has increased sharply, and electric vehicles, energy storage batteries, robots, satellites, and the like have been developed in earnest. Accordingly, high-performance battery cells allowing repeated charging and discharging are being actively studied.

Battery cells commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Since the battery cell is degraded as it is used, in order to accurately estimate the state of charge (SOC) and/or state of health (SOH) for the degraded battery cell, various profiles are required for analyzing the degree of degradation of the battery cell. For example, when a battery profile, a positive electrode profile, and a negative electrode profile for a battery cell are provided, the degree of degradation of the battery cell may be analyzed most accurately.

Conventionally, in order to obtain a positive electrode profile and a negative electrode profile of a battery cell, a positive electrode and a negative electrode are disassembled from the battery cell, the positive electrode and the negative electrode are washed, and then a positive electrode half-cell and a negative electrode half-cell are reassembled so that a positive electrode profile and a negative electrode profile are respectively obtained from the reassembled positive and negative electrode half cells through an experimental method such as a 3-electrode system. It took a considerable amount of time to obtain a positive electrode profile and a negative electrode profile through this process, and in particular, there is a problem in that the battery cell is exposed to the risk of explosion when the battery cell is disassembled.

Therefore, it is required to develop a technology for obtaining a negative electrode profile and/or a positive electrode profile of a battery cell in a rapid and non-destructive manner.

DISCLOSURE

Technical Problem

The present disclosure is designed to solve the problems of the related art, and therefore the present disclosure is directed to providing a battery management apparatus and method, which may obtain a positive electrode profile and a negative electrode profile for a battery cell in a non-destructive manner by appropriately adjusting a preset negative electrode profile.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to an aspect of the present disclosure may comprise: a measuring unit configured to measure voltage and capacity of a battery cell; a profile generating unit configured to receive a voltage value for the voltage and a capacity value for the capacity from the measuring unit and generate a battery profile representing a correspondence between the voltage value and the capacity value; a profile converting unit configured to receive the battery profile from the profile generating unit and convert the received battery profile into a battery differential profile representing a correspondence between the capacity value and a differential voltage value for the capacity value; and a control unit configured to determine at least one reference peak in the battery differential profile, have a negative electrode profile and a negative electrode differential profile preset for a negative electrode of the battery cell, adjust the negative electrode differential profile so that at least one target peak preset for the negative electrode differential profile corresponds to the determined reference peak, adjust the negative electrode profile to correspond to the adjusted negative electrode differential profile, and generate a positive electrode profile of the battery cell based on the adjusted negative electrode profile and the battery profile.

The control unit may be configured to determine a plurality of reference peaks in the battery differential profile and adjust the negative electrode differential profile to be the same as a capacity value of a reference peak to which capacity values of a plurality of target peaks preset in the negative electrode differential profile correspond.

The control unit may be configured to adjust the negative electrode differential profile while changing an offset corresponding to a minimum capacity value of the negative electrode differential profile and a scale representing an entire capacity region of the negative electrode differential profile.

The control unit may be configured to adjust the negative electrode profile to correspond to the adjusted negative electrode differential profile by applying change information of the offset and the scale for the adjusted negative electrode differential profile to the negative electrode profile.

The control unit may be configured to generate the positive electrode profile by adding the voltage value of the battery profile and the voltage value of the adjusted negative electrode profile for each identical capacity value.

The control unit may be configured to select a first capacity region and a second capacity region in an entire capacity region of the battery profile, determine a first reference peak in the first capacity region of the battery profile, and determine a second reference peak in the second capacity region of the battery profile.

The control unit may be configured to determine a peak at which an instantaneous change rate of the differential voltage value for the capacity value in the first capacity region of the battery profile is 0 and whose differential voltage value is greatest as the first reference peak. The control unit may be configured to determine a peak at which an instantaneous change rate of the differential voltage value for the capacity value in the second capacity region of the battery profile is 0 and whose differential voltage value is greatest as the second reference peak.

The negative electrode profile may be a profile preset to represent a correspondence between the capacity value and a negative electrode voltage value of the battery cell.

The negative electrode differential profile may be a profile preset to represent a correspondence between the capacity value and a differential negative electrode voltage value of the negative electrode voltage value for the capacity value.

A battery pack according to another embodiment of the present disclosure may comprise the battery management apparatus according to an embodiment of the present disclosure.

A battery management method according to still another embodiment of the present disclosure may comprise: a measuring step of measuring voltage and capacity of a battery cell; a battery profile generating step of generating a battery profile representing a correspondence between a voltage value for the voltage and a capacity value for the capacity measured in the measuring step; a battery profile converting step of converting the battery profile into a battery differential profile representing a correspondence between the capacity value and a differential voltage value for the capacity value; a reference peak determining step of determining at least one reference peak in the battery differential profile; a negative electrode differential profile adjusting step of adjusting a negative electrode differential profile so that at least one target peak preset for the negative electrode differential profile of the battery cell provided in advance corresponds to the determined reference peak; a negative electrode profile adjusting step of adjusting a negative electrode profile of the battery cell provided in advance to correspond to the adjusted negative electrode differential profile; and a positive electrode profile generating step of generating a positive electrode profile of the battery cell based on the adjusted negative electrode profile and the battery profile.

Advantageous Effects

According to one aspect of the present disclosure, by using the battery profile and the adjusted negative electrode profile for the degraded battery cell, there is an advantage that the positive electrode profile of the degraded battery cell may be easily estimated in a non-destructive manner.

In addition, according to one aspect of the present disclosure, since the battery profile, the adjusted negative electrode profile, and the positive electrode profile corresponding to each other may be provided, there is an advantage in that various data necessary for analyzing the state of the battery cell may be provided.

The effects of the present disclosure are not limited to the effects mentioned above, and other effects not mentioned will be clearly understood by those skilled in the art from the description of the claims.

BRIEF DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODES OF PRACTICE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
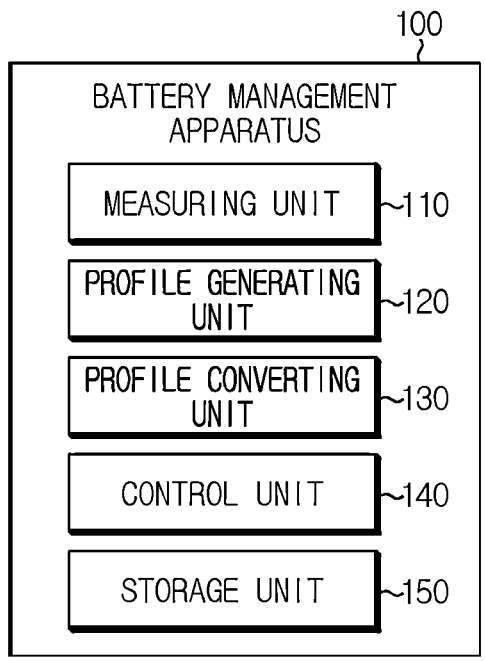
FIG. 1 is a diagram schematically showing a battery management apparatus according to an embodiment of the present disclosure.
Figure 2:
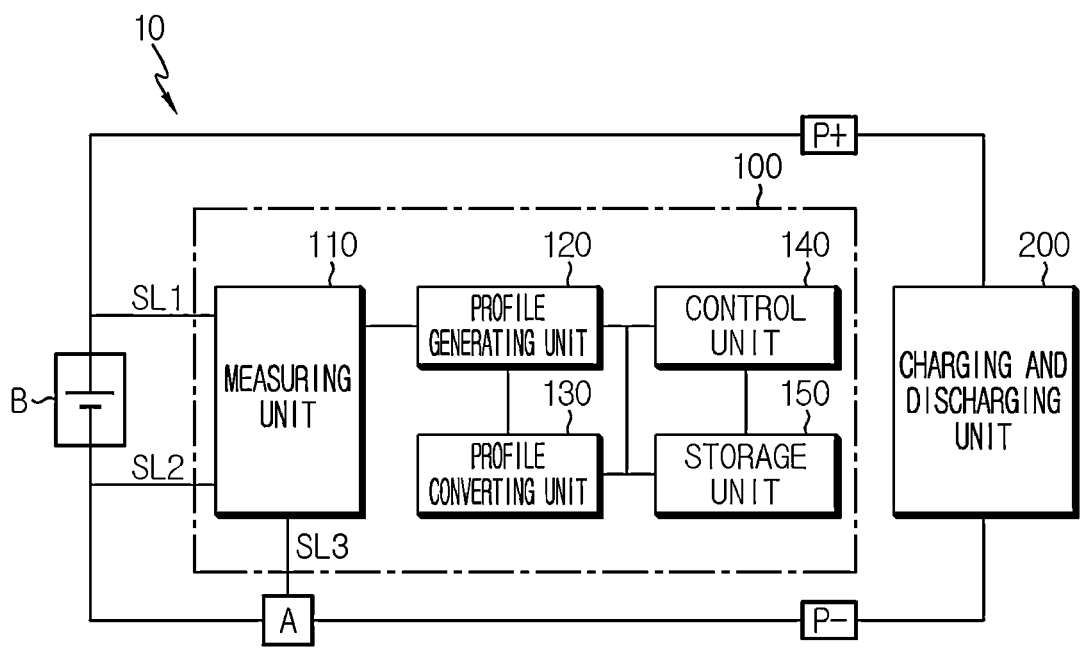
FIG. 2 is a diagram showing an exemplary configuration of a battery pack including the battery management apparatus according to an embodiment of the present disclosure.

FIG. 1 is a diagram schematically showing a battery management apparatus 100 according to an embodiment of the present disclosure. FIG. 2 is a diagram showing an exemplary configuration of a battery pack 10 including the battery management apparatus 100 according to an embodiment of the present disclosure.

Referring to FIG. 1, the battery management apparatus 100 may include a measuring unit 110, a profile generating unit 120, a profile converting unit 130, and a control unit 140.

Here, a battery cell B means one independent cell that includes a negative electrode terminal and a positive electrode terminal and is physically separable. For example, one pouch-type lithium polymer cell may be regarded as a battery.

The measuring unit 110 may be configured to measure voltage and capacity of the battery cell B.

Specifically, the measuring unit 110 may measure the voltage of the battery by measuring voltages at both ends of the battery cell B, respectively. Also, the measuring unit 110 may measure the current applied to the battery cell B and the charging time while the battery cell B is being charged. In addition, the measuring unit 110 may measure the capacity of the battery cell B based on the measured current of the battery cell B and the charging time.

For example, in the embodiment of FIG. 2, the measuring unit 110 may be connected to a first sensing line SL1, a second sensing line SL2, and a third sensing line SL3. The measuring unit 110 may measure the voltage of the battery cell B through the first sensing line SL1 and the second sensing line SL2. In addition, the measuring unit 110 may be connected to a current measuring unit A through the third sensing line SL3, and may measure the current of the battery cell B through the current measuring unit A. Preferably, the measuring unit 110 may include a timer capable of measuring the charging time while measuring the current of the battery cell B.

The profile generating unit 120 may be configured to receive a voltage value (V) for the voltage and a capacity value (Q) for the capacity from the measuring unit 110. Here, the unit of the voltage value may be [V], and the unit of the capacity value may be [mAh].

The profile generating unit 120 may be connected to communicate with the measuring unit 110. For example, in the embodiment of FIG. 2, the profile generating unit 120 may be connected to the measuring unit 110 to receive the measured voltage value and the measured capacity value of the battery cell B from the measuring unit 110.

In addition, the profile generating unit 120 may be configured to generate a battery profile (Pb) representing a correspondence between the voltage value and the capacity value.

Specifically, the battery profile (Pb) may be a profile configured to represent the correspondence between the voltage value and the capacity value of the battery cell B measured at the same time by the measuring unit 110.

Figure 3:
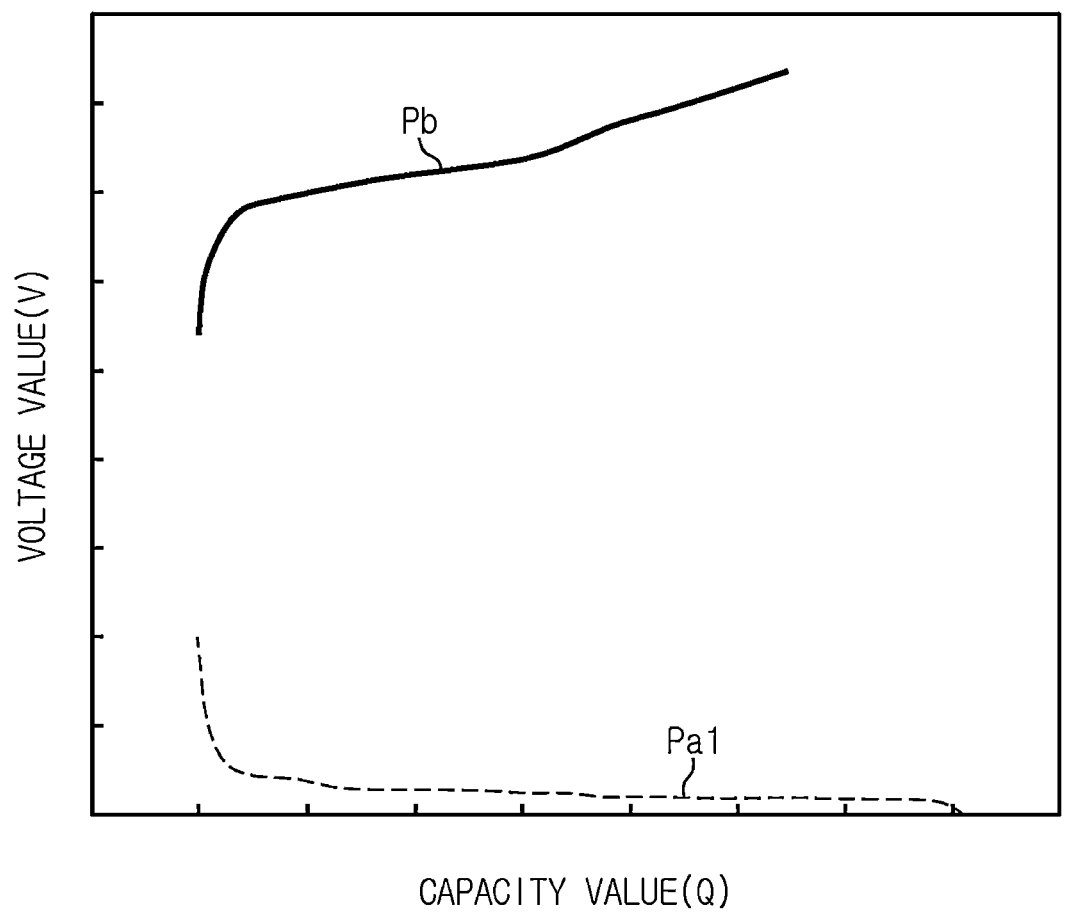
FIG. 3 is a diagram schematically showing a battery profile and a negative electrode profile according to an embodiment of the present disclosure.

FIG. 3 is a diagram schematically showing a battery profile (Pb) and a negative electrode profile (Pa1) according to an embodiment of the present disclosure. Here, FIG. 3 is a diagram schematically showing the battery profile (Pb) and the negative electrode profile (Pa1) in a graph form. Specifically, FIG. 3 is a diagram schematically showing an X-Y graph when a capacity value is set to X and a voltage value is set to Y.

The profile converting unit 130 may be configured to receive the battery profile (Pb) from the profile generating unit 120.

For example, in the embodiment of FIG. 3, the profile converting unit 130 may be communicatively connected to the profile generating unit 120 and may receive the battery profile (Pb) from the profile generating unit 120.

In addition, the profile converting unit 130 may be configured to convert the received battery profile (Pb) into a battery differential profile (Pb_d) representing a correspondence between the capacity value and a differential voltage value (dV/dQ) for the capacity value. Here, the differential voltage value is a value obtained by differentiating the voltage value with respect to the capacity value of the battery cell B, and may be expressed as "dV/dQ", whose unit is [V/mAh]. That is, the differential voltage value may be a value representing an instantaneous change rate of the voltage value with respect to the capacity value of the battery cell B.

Specifically, the profile converting unit 130 may convert the battery profile (Pb) representing the correspondence between the capacity value and the voltage value of the battery cell B into the battery differential profile (Pb_d) representing the correspondence between the capacity value and the differential voltage value of the battery cell B.

Figure 4:
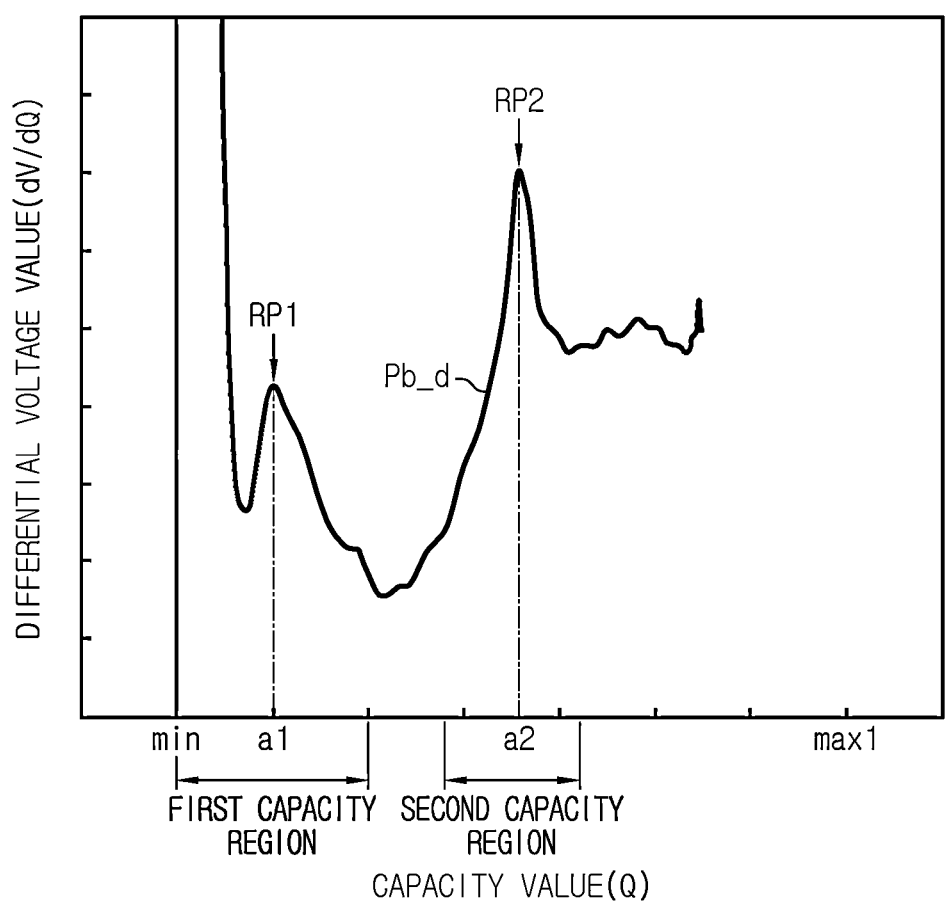
FIG. 4 is a diagram schematically showing a battery differential profile according to an embodiment of the present disclosure.

FIG. 4 is a diagram schematically showing a battery differential profile (Pb_d) according to an embodiment of the present disclosure. Here, FIG. 4 is a diagram showing the battery differential profile (Pb_d) in a graph form. Specifically, FIG. 4 is a diagram schematically showing an X-Y graph when the capacity value of the battery cell B is set to X and the differential voltage value of the battery cell B is set to Y.

The control unit 140 may be configured to determine at least one reference peak in the battery differential profile (Pb_d).

Preferably, the control unit 140 may be configured to determine a plurality of reference peaks in the battery differential profile (Pb_d). More preferably, the control unit 140 may be configured to determine two reference peaks in the battery differential profile (Pb_d).

First, the control unit 140 may be configured to select a first capacity region and a second capacity region in an entire capacity region of the battery profile (Pb).

Here, the first capacity region and the second capacity region may be preset not to overlap each other. Preferably, information on the first capacity region and the second capacity region may be stored in advance in the control unit 140 and/or a storage unit 150.

Specifically, the first capacity region and the second capacity region may be capacity regions set in consideration of electrochemical characteristics of the battery. That is, in the battery differential profile (Pb_d) according to the voltage value and the capacity value of the battery cell B obtained while the battery cell B is being charged, a predetermined capacity region in which the first reference peak (RP1) may appear may be set as the first capacity region, and a predetermined capacity region in which a second reference peak (RP2) may appear may be set as the second capacity region.

More specifically, in an entire capacity region of the negative electrode half-cell of the BOL battery cell B, the first capacity region may be set from a lowest capacity value to a predetermined first region such that the capacity value of the first reference peak (RP1) is included. For example, in the embodiment of FIG. 4, the first capacity region may be preset as "min" to "min+{(max1−min)×0.3}" region in the entire capacity region (min to max1 region). Here, min may be the minimum capacity value of the entire capacity region, and max may be the maximum capacity value of the entire capacity region.

In an entire capacity region of the negative electrode half-cell of the BOL battery cell B, the second capacity region may be set as a predetermined second region such that the capacity value of the second reference peak (RP2) is included. For example, in the embodiment of FIG. 4, the second capacity region may be preset as "min+{(max1−min)×0.4}" to "min+{(max1−min)×0.6}" region in the entire capacity region (min to max1 region).

Next, the control unit 140 may be configured to determine a first reference peak (RP1) in the first capacity region of the battery profile (Pb) and determine a second reference peak (RP2) in the second capacity region of the battery profile (Pb).

Specifically, the control unit 140 may be configured to determine a peak at which the instantaneous change rate of the differential voltage value for the capacity value in the first capacity region of the battery profile (Pb) is 0 and whose differential voltage value is greatest as the first reference peak (RP1). In addition, the control unit 140 may be configured to determine a peak at which the instantaneous change rate of the differential voltage value for the capacity value in the second capacity region of the battery profile (Pb) is 0 and whose differential voltage value is greatest as the second reference peak (RP2).

In summary, the reference peak may be a peak at which the instantaneous change rate of the differential voltage value for the capacity value is 0 and whose differential voltage value is greatest in each of the first capacity region and the second capacity region. In addition, an instantaneous change rate of a low capacity (the instantaneous change rate of the differential voltage value for the capacity value) based on the reference peak may be positive, and an instantaneous change rate of a high capacity based on the reference peak may be negative. That is, the reference peak may be a point having an upward convex shape in the X-Y graph. For example, in the embodiment of FIG. 4, the control unit 140 may determine the first reference peak (RP1) in the first capacity region. In addition, the control unit 140 may determine the second reference peak (RP2) in the second capacity region.

The control unit 140 may be configured to have a negative electrode profile (Pa1) and a negative electrode differential profile (Pa_d1) preset for the negative electrode of the battery cell B.

Here, the negative electrode profile (Pa1) may be a profile preset to represent a correspondence between the capacity value and a negative electrode voltage value of the battery cell B. Specifically, the negative electrode profile (Pa1) may represent the correspondence between the capacity value of the battery cell B measured during the charging process of the battery cell B in a BOL state and the negative electrode voltage value of the battery cell B. That is, the negative electrode profile (Pa1) may be a profile for a negative electrode cell in a BOL state.

For example, in the embodiment of FIG. 3, the negative electrode profile Pa1 is a profile representing the correspondence between the capacity value and the voltage value of a negative electrode half-cell. In contrast, the battery profile (Pb) is a profile representing the correspondence between the capacity value and the voltage value of a full cell.

Figure 5:
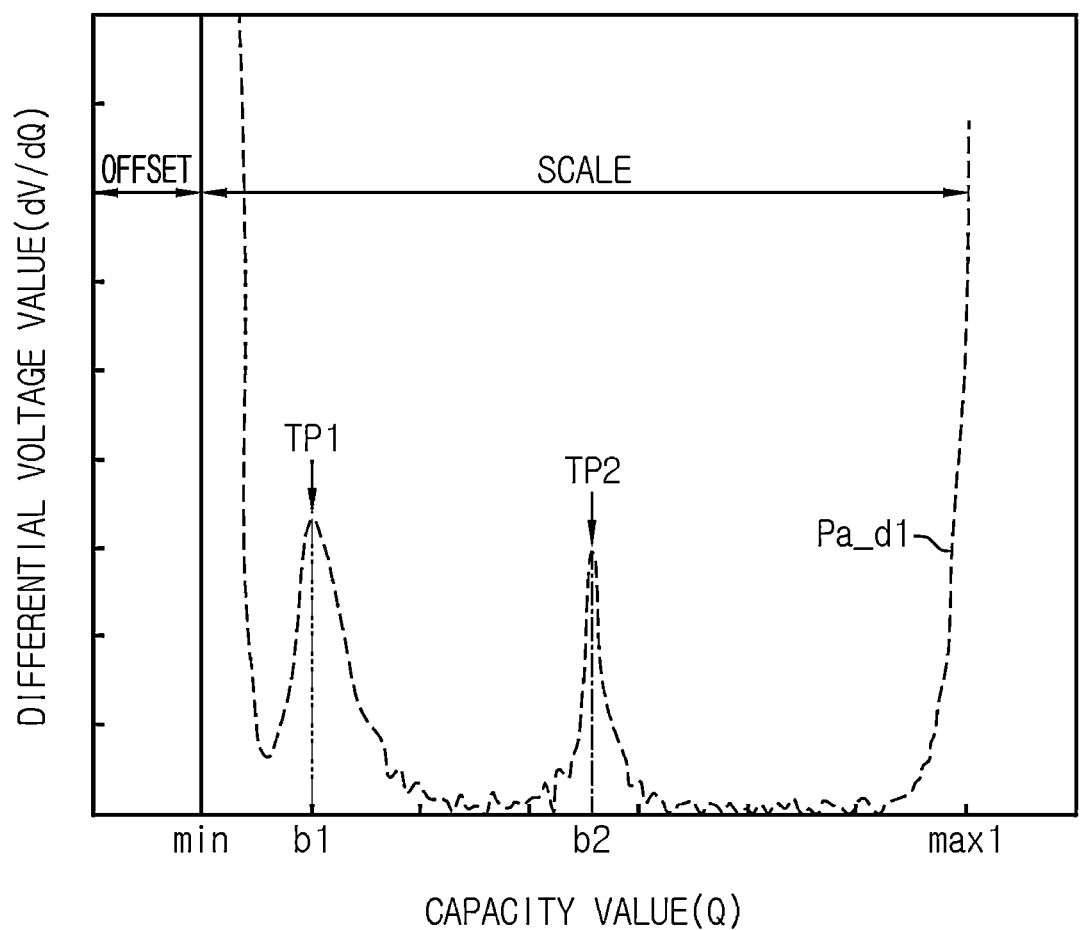
FIG. 5 is a diagram schematically showing a negative electrode differential profile according to an embodiment of the present disclosure.

FIG. 5 is a diagram schematically showing a negative electrode differential profile (Pa_d1) according to an embodiment of the present disclosure.

In addition, the negative electrode differential profile (Pa_d1) may be a profile preset to represent the correspondence between the capacity value and a differential negative electrode voltage value of the negative electrode voltage value for the capacity value.

Specifically, the negative electrode differential profile (Pa_d1) of FIG. 5 is a profile obtained by converting the negative electrode profile (Pa1) of FIG. 3 to represent the correspondence between the capacity value and the differential voltage value. More specifically, the negative electrode differential profile (Pa_d1) of the battery cell B in a BOL state as in FIG. 5 is a diagram schematically showing an X-Y graph when the capacity value is set to X and the differential voltage value is set to Y. That is, the negative electrode differential profile (Pa_d1) may be a differential profile for a negative electrode cell in a BOL state.

For example, the negative electrode profile (Pa1) and the negative electrode differential profile (Pa_d1) may be stored in advance in the storage unit 150, and the control unit 140 may access the storage unit 150 to obtain the negative electrode profile (Pa1) and the negative electrode differential profile (Pa_d1). As another example, the negative electrode profile (Pa1) and the negative electrode differential profile (Pa_d1) may be preset and stored in advance in an internal memory of the control unit 140.

The control unit 140 may be configured to adjust the negative electrode differential profile (Pa_d1) so that at least one target peak preset for the negative electrode differential profile (Pa_d1) corresponds to the determined reference peak.

For example, in the embodiment of FIG. 5, a first target peak (TP1) and a second target peak (TP2) may be preset in the negative electrode differential profile (Pa_d1). In addition, the control unit 140 may adjust the negative electrode differential profile (Pa_d1) such that the first target peak (TP1) and the second target peak (TP2) correspond to the first reference peak (RP1) and the second reference peak (RP2) of the battery differential profile (Pb_d), respectively.

The control unit 140 may be configured to adjust the negative electrode profile Pa1 to correspond to the adjusted negative electrode differential profile.

Specifically, the control unit 140 may adjust the negative electrode profile (Pa1) by applying conversion information for the adjusted negative electrode differential profile to the negative electrode profile (Pa1).

The control unit 140 may be configured to generate a positive electrode profile of the battery cell B based on the adjusted negative electrode profile (Pa2) and the battery profile (Pb).

Figure 6:
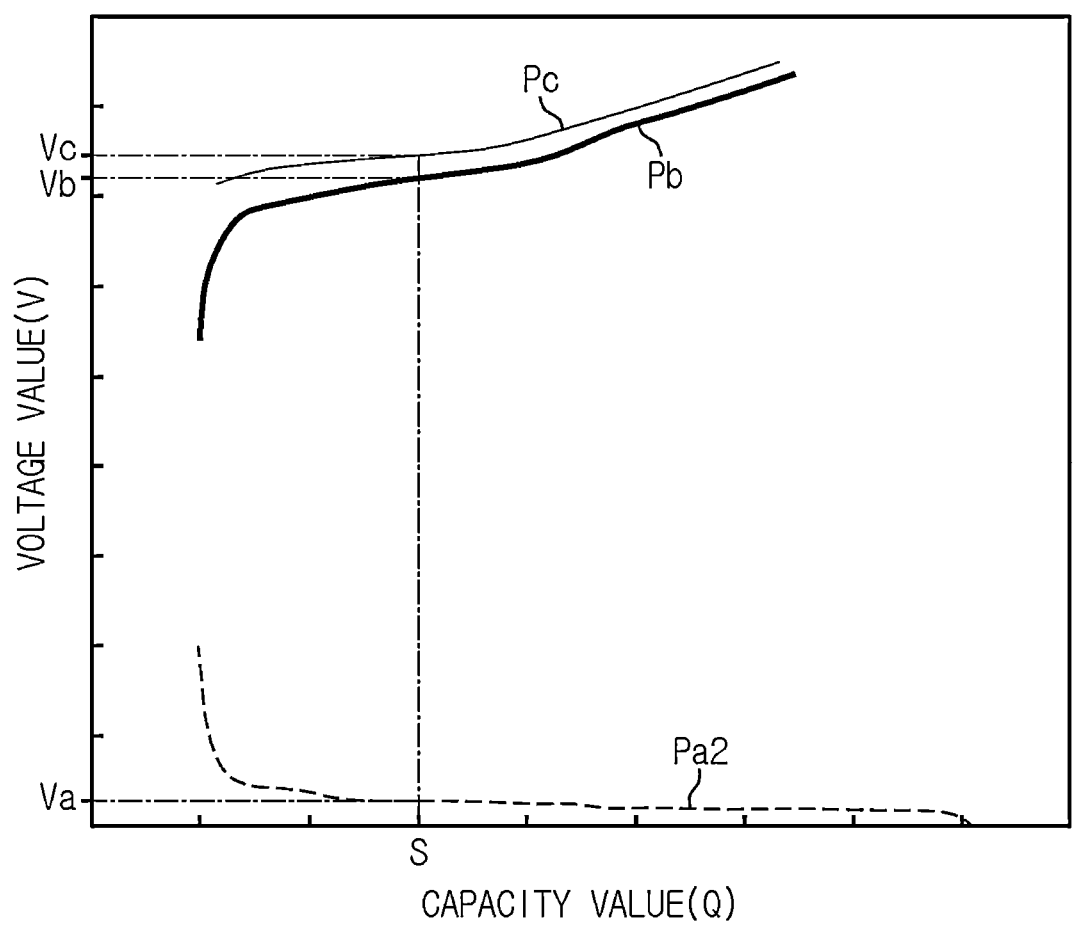
FIG. 6 is a diagram schematically showing a battery profile, an adjusted negative electrode profile, and a generated positive electrode profile according to an embodiment of the present disclosure.

FIG. 6 is a diagram schematically showing a battery profile (Pb), an adjusted negative electrode profile (Pa2), and a generated positive electrode profile (Pc) according to an embodiment of the present disclosure. Here, FIG. 6 is a diagram showing the battery profile (Pb), the adjusted negative electrode profile (Pa2), and the generated positive electrode profile (Pc) in a graph form. Specifically, FIG. 6 is a diagram schematically showing an X-Y graph when the capacity value is set to X and the voltage value is set to Y.

When the battery cell B is degraded, the battery profile (Pb) may be the degradation profile for the degraded battery cell B. By adjusting the negative electrode differential profile (Pa_d1) for the battery cell B in a BOL state by the control unit 140, the negative electrode profile (Pa1) may be adjusted to correspond to the degradation profile. Accordingly, the control unit 140 may generate a positive electrode profile (Pc) corresponding to the current state of the battery cell B based on the battery profile (Pb) for the degenerated battery cell B and the adjusted negative electrode profile (Pa2).

For example, it is assumed that the battery cell B is degraded by 10% compared to the BOL state. The battery profile (Pb) generated by the profile generating unit 120 may be a profile for the battery cell B that is degraded by 10%. In addition, the negative electrode profile (Pa2) adjusted by the control unit 140 may be a negative electrode profile of the battery cell B that is degraded by 10%. Accordingly, the control unit 140 may generate the positive electrode profile (Pc) of the battery cell degraded by 10% based on the battery profile (Pb) and the adjusted negative electrode profile (Pa2).

Specifically, as described above, in the prior art, a positive electrode and a negative electrode are disassembled from the battery cell B, a positive electrode cell and a negative electrode cell are respectively reassembled for sampling, and a positive electrode profile and a negative electrode profile are obtained based on the reassembled positive and negative electrode cells, respectively. This process takes a considerable amount of time, and there is a problem in that the battery cell B is exposed to the risk of explosion when the battery cell B is disassembled.

Meanwhile, the battery management apparatus 100 according to an embodiment of the present disclosure has an advantage of easily estimating that the positive electrode profile (Pc) of the degraded battery cell B by using the battery profile (Pb) for the degraded battery cell B and the adjusted negative electrode profile (Pa2), considering that the shape of the negative electrode profile (Pa1) is kept constant even if the battery cell B is degraded.

That is, the negative electrode profile (Pa1) may maintain the shape of the graph constant even if the battery cell B is degraded. However, since the shape of the graph changes as the battery cell B is degraded, there is a problem in that the positive electrode profile (Pc) may not be easily estimated with only the battery profile (Pb). Therefore, the battery management apparatus 100 may easily estimate the positive electrode profile (Pc) by using the battery profile (Pb) and the adjusted negative electrode profile (Pa2).

In addition, according to an embodiment of the present disclosure, it is possible to estimate the positive electrode profile (Pc) of the battery cell B in a non-destructive manner. Accordingly, the battery management apparatus 100 has an advantage of estimating the positive electrode profile (Pc) of the battery cell B installed at the battery pack 10, an electric vehicle, an energy storage device, or the like in a non-destructive manner.

Meanwhile, the control unit 140 provided to the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 140 may be implemented as a set of program modules. At this time, the program module may be stored in a memory and executed by the control unit 140. The memory may be located inside or out of the control unit 140 and may be connected to the control unit 140 by various well-known means.

In addition, the storage unit 150 may store programs, data and the like required for the battery management apparatus 100 to generate a positive electrode profile Pc. That is, the storage unit 150 may store data necessary for operation and function of each component of the battery management apparatus 100, data generated in the process of performing the operation or function, or the like. The storage unit 150 is not particularly limited in its kind as long as it is a known information storage means that can record, erase, update and read data. As an example, the information storage means may include RAM, flash memory, ROM, EEPROM, registers, and the like. In addition, the storage unit 150 may store program codes in which processes executable by the profile generating unit 120, the profile converting unit 130 and the control unit 140 are defined.

For example, the storage unit 150 may store the preset negative electrode profile (Pa1) and the negative electrode differential profile (Pa_d1). In this case, the control unit 140 may access the storage unit 150 and obtain the negative electrode profile (Pa1) and the negative electrode differential profile (Pa_d1) in order to generate a positive electrode profile (Pc). In addition, the battery profile (Pb) generated by the profile generating unit 120, the negative electrode profile (Pa2) adjusted by the control unit 140, and the positive electrode profile (Pc) generated by the control unit 140 may be mapped to each other and stored in the storage unit 150. Accordingly, the battery management apparatus 100 has an advantage of providing the battery profile (Pb), the adjusted negative electrode profile (Pa2), and the positive electrode profile (Pc) corresponding to each other.

Hereinafter, more specific embodiments of the first capacity region and the second capacity region will be described in consideration of the characteristics of the battery cell B.

Specifically, in the embodiment of FIG. 5, the first target peak (TP1) and the second target peak (TP2) included in the negative electrode differential profile (Pa_d1) may be related to the staging phenomenon in which lithium ions are extracted during the discharge process.

In general, when the battery cell B is discharged, a staging process in which lithium ions contained between graphite layers are extracted is performed. The staging process in the discharge process proceeds from a high stage to a low stage according to the extraction reaction of lithium ions. For example, in the discharge process, the staging process is performed in the order of stage IV, stage III, stage II, and stage I.

For example, in the embodiment of FIG. 5, the capacity (b1) of the first target peak (TP1) included in the negative electrode differential profile (Pa_d1) may correspond to the negative electrode capacity when the stage III state progresses. Specifically, the capacity (b1) of the first target peak (TP1) may correspond to the negative electrode capacity when the stage II and stage III states that are coexisting are converted to the stage III state.

In addition, in the embodiment of FIG. 5, the capacity (b2) of the second target peak (TP2) included in the negative electrode differential profile (Pa_d1) may correspond to the negative electrode capacity when the stage II state progresses. Specifically, the capacity (b2) of the second target peak (TP2) may correspond to the negative electrode capacity when the stage I and stage II states that are coexisting are converted to the stage II state.

In addition, due to the characteristics of the battery cell B, the capacity corresponding to the first target peak (TP1) and the second target peak (TP2) may not change significantly even if the battery cell B is degraded. In addition, depending on the degree of degradation of the battery cell B, the capacity of each of the first reference peak (RP1) and the second reference peak (RP2) may be the same as or similar to the capacity of the first target peak (TP1) and the second target peak (TP2).

Accordingly, the first capacity region is a capacity region in which the first reference peak (RP1) is expected to appear, and may be set as a region in which the capacity of the first target peak (TP1) is considered. Similarly, the second capacity region is a capacity region in which the second reference peak (RP2) is expected to appear, and may be set as a region in which the capacity of the second target peak (TP2) is considered.

For example, in the embodiment of FIG. 4, the first capacity region may be set as a capacity region of 0Q to 30Q in the entire capacity region (min to max1 region) of the negative electrode half cell of the BOL battery cell B. In addition, the second capacity region may be set as a capacity region of 40Q to 60Q in the entire capacity region (min to max1 region) of the negative electrode half-cell of the BOL battery cell B. Here, for example, the unit of capacity (Q) may be [mAh].

Figure 7:
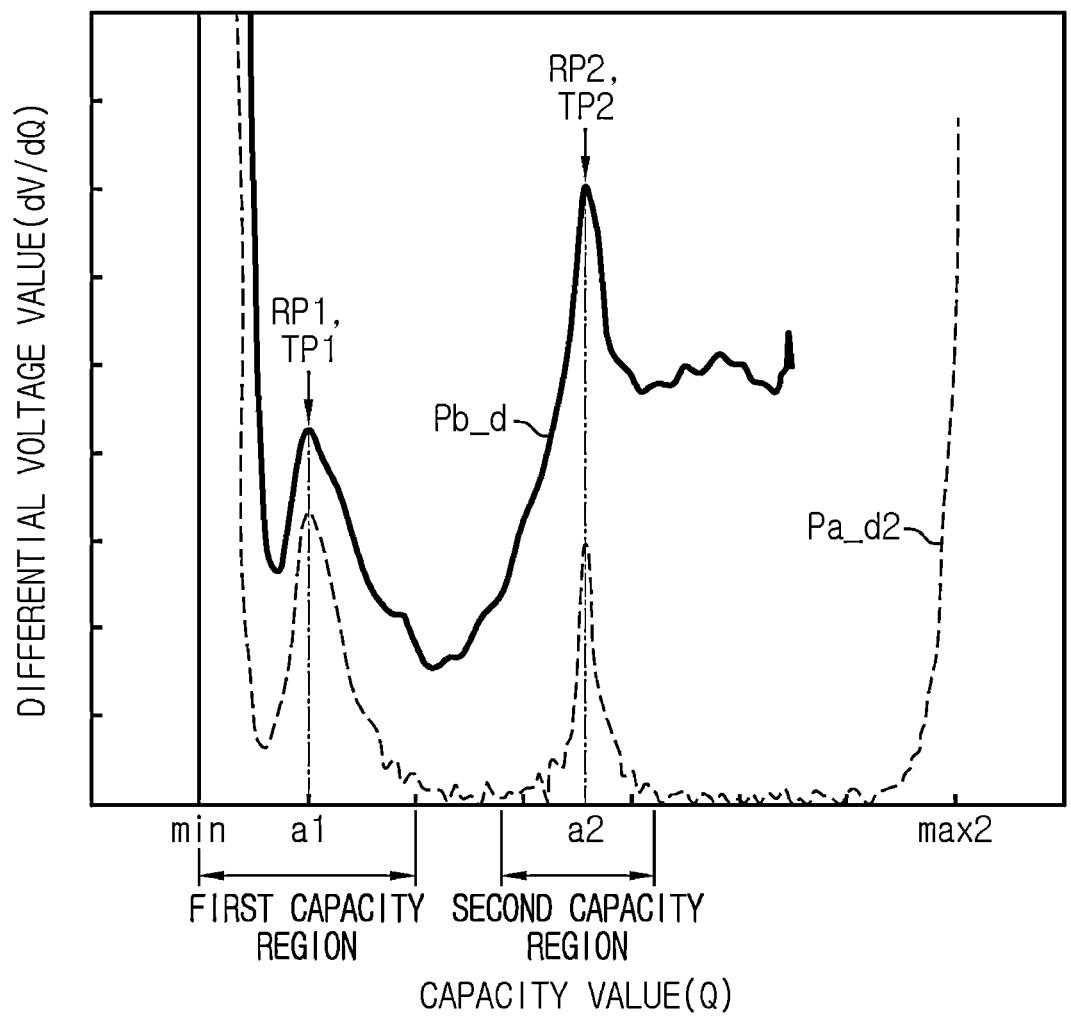
FIG. 7 is a diagram schematically showing a battery differential profile and an adjusted negative electrode differential profile according to an embodiment of the present disclosure.

FIG. 7 is a diagram schematically showing a battery differential profile (Pb_d) and an adjusted negative electrode differential profile (Pa_d2) according to an embodiment of the present disclosure.

The control unit 140 may be configured to determine a plurality of reference peaks in the battery differential profile (Pb_d).

For example, the control unit 140 may determine two reference peaks in the battery differential profile (Pb_d). In this case, the control unit 140 may determine the first reference peak (RP1) in the first capacity region of the battery differential profile (Pb_d) and determine the second reference peak (RP2) in the second capacity region.

In addition, the control unit 140 may be configured to adjust the negative electrode differential profile (Pa_d1) so that a capacity value of a plurality of target peaks preset in the negative electrode differential profile (Pa_d1) is equal to a capacity value of a corresponding reference peak.

Specifically, the control unit 140 may adjust the negative electrode differential profile (Pa_d1) so that the capacity values of the corresponding reference peak and the target peak become the same. That is, the control unit 140 may adjust the negative electrode differential profile (Pa_d1) according to the battery differential profile (Pb_d).

Preferably, the control unit 140 may be configured to adjust the negative electrode differential profile (Pa_d1) while changing the offset corresponding to the minimum capacity value of the negative electrode differential profile (Pa_d1) and the scale representing the entire capacity region of the negative electrode differential profile (Pa_d1).

Referring to FIG. 5, the offset may represent the minimum capacity value (min) at which the negative electrode differential profile (Pa_d1) starts. In addition, the scale may represent the entire capacity region (min to max1 region) of the negative electrode differential profile (Pa_d1).

For example, referring to FIGS. 5 and 7, the control unit 140 may adjust the scale of the negative electrode differential profile (Pa_d1) of FIG. 5 to generate the negative electrode differential profile (Pa_d2) of FIG. 7. That is, the capacity value of the first target peak (TP1) included in the negative electrode differential profile (Pa_d1) may be b1 [mAh], the capacity value of the second target peak (TP2) may be b2 [mAh], the minimum capacity value may be min [mAh], and the maximum capacity value may be max1 [mAh]. The capacity value of the first target peak (TP1) included in the adjusted negative electrode differential profile (Pa_d2) may be a1 [mAh], the capacity value of the second target peak (TP2) may be a2 [mAh], the minimum capacity value may be min [mAh], and the maximum capacity value may be max2 [mAh]. Here, assuming that a1 [mAh] and b1 [mAh] are different values and a2 [mAh] and b2 [mAh] are different values, max1 [mAh] and max2 [mAh] may also be different values.

As described above, the shape of the negative electrode profile (Pa1) of the battery cell B may be maintained even if the battery cell B is degraded. That is, the scale and offset of the negative electrode profile of the degraded battery cell B may be changed compared to the negative electrode profile (Pa1) of the battery cell B in the BOL state, but the original shape may be maintained.

For example, since the negative electrode profile of the degraded battery cell B may vary in terms of the minimum capacity value and/or the size of the entire capacity region in the negative electrode profile (Pa1) of the battery cell B in the BOL state, even if battery cell B is degraded, the shape of the electrode profile (Pa1) may be maintained. That is, even if the battery cell B is degraded, only the scale of a partial capacity region of the entire capacity region of the negative electrode profile (Pa1) is not changed and the scale of the entire capacity region of the negative electrode profile (Pa1) is changed as a whole, so that the shape of the negative electrode profile (Pa1) may be maintained even if the battery cell B is degraded.

Accordingly, the control unit 140 may adjust the negative electrode differential profile (Pa_d1) by adjusting the offset and the scale of the negative electrode differential profile (Pa_d1), so that the capacity value of the target peak becomes equal to the capacity value of the corresponding reference peak.

Then, the control unit 140 may be configured to adjust the negative electrode profile (Pa1) to correspond to the adjusted negative electrode differential profile (Pa_d2) by applying the change information of the offset and scale for the adjusted negative electrode differential profile (Pa_d2) to the negative electrode profile (Pa1). That is, by adjusting the offset and scale of the negative electrode profile (Pa1) by the control unit 140 to correspond to the offset and scale of the adjusted negative electrode differential profile (Pa_d2), the adjusted negative electrode profile (Pa2) may be generated.

The control unit 140 may be configured to generate the positive electrode profile (Pc) by adding the voltage value of the battery profile (Pb) and the voltage value of the adjusted negative electrode profile (Pa2) for each identical capacity value.

In general, a battery profile may be generated according to the difference between the positive electrode profile and the negative electrode profile. By applying this reversely, the control unit 140 may generate a positive electrode profile (Pc) by adding the battery profile (Pb) and the adjusted negative electrode profile (Pa2).

For example, in the embodiment of FIG. 6, when the capacity value is S [mAh], the voltage value of the battery profile (Pb) may be Vb [V], and the voltage value of the adjusted negative electrode profile (Pa2) may be Va [V]. The control unit 140 may generate a positive electrode profile (Pc) having a voltage value of Vc [V] at the capacity value S [mAh] by calculating the formula of "Vb+Va". In this way, the control unit 140 may generate a positive electrode profile (Pc) by adding the voltage value of the battery profile (Pb) and the voltage value of the adjusted negative electrode profile (Pa2) for the entire capacity region of the battery profile (Pb).

The battery management apparatus 100 according to an embodiment of the present disclosure has an advantage of estimating the adjusted negative electrode profile (Pa2) and the positive electrode profile (Pc) corresponding to the current state of the battery cell B in a non-destructive manner. That is, even when the battery cell B is installed at a battery pack 10 or the like, it is possible to generate the battery profile (Pb), the adjusted negative electrode profile (Pa2), and the positive electrode profile (Pc) individually in a non-destructive manner. Therefore, the battery management apparatus 100 has an advantage of providing various information for analyzing the cause of degradation and the degree of degradation of the battery cell B.

The battery management apparatus 100 according to the present disclosure may be applied to a BMS (Battery Management System). That is, the BMS according to the present disclosure may include the battery management apparatus 100. In this configuration, at least some of the components of the battery management apparatus 100 may be implemented by supplementing or adding functions of components included in a conventional BMS. For example, the measuring unit 110, the profile generating unit 120, the profile converting unit 130, the control unit 140 and the storage unit 150 of the battery management apparatus 100 may be implemented as components of the BMS.

In addition, the battery management apparatus 100 may be provided to a battery pack 10. That is, the battery pack 10 according to the present disclosure may include the battery management apparatus 100 as described above and at least one battery cell B. In addition, the battery pack 10 may further include electrical equipment (relays, fuses, etc.), a case, and the like.

For example, in the embodiment of FIG. 2, the battery pack 10 may include a battery cell B and the battery management apparatus 100. In addition, a charging and discharging unit 200 may be connected to a positive electrode terminal (P+) and a negative electrode terminal (P−) of the battery pack 10 to charge or discharge the battery cell B. As another example, in the embodiment of FIG. 2, all of the battery cell B, the battery management apparatus 100, and the charging and discharging unit 200 may be included in the battery pack 10.

Figure 8:
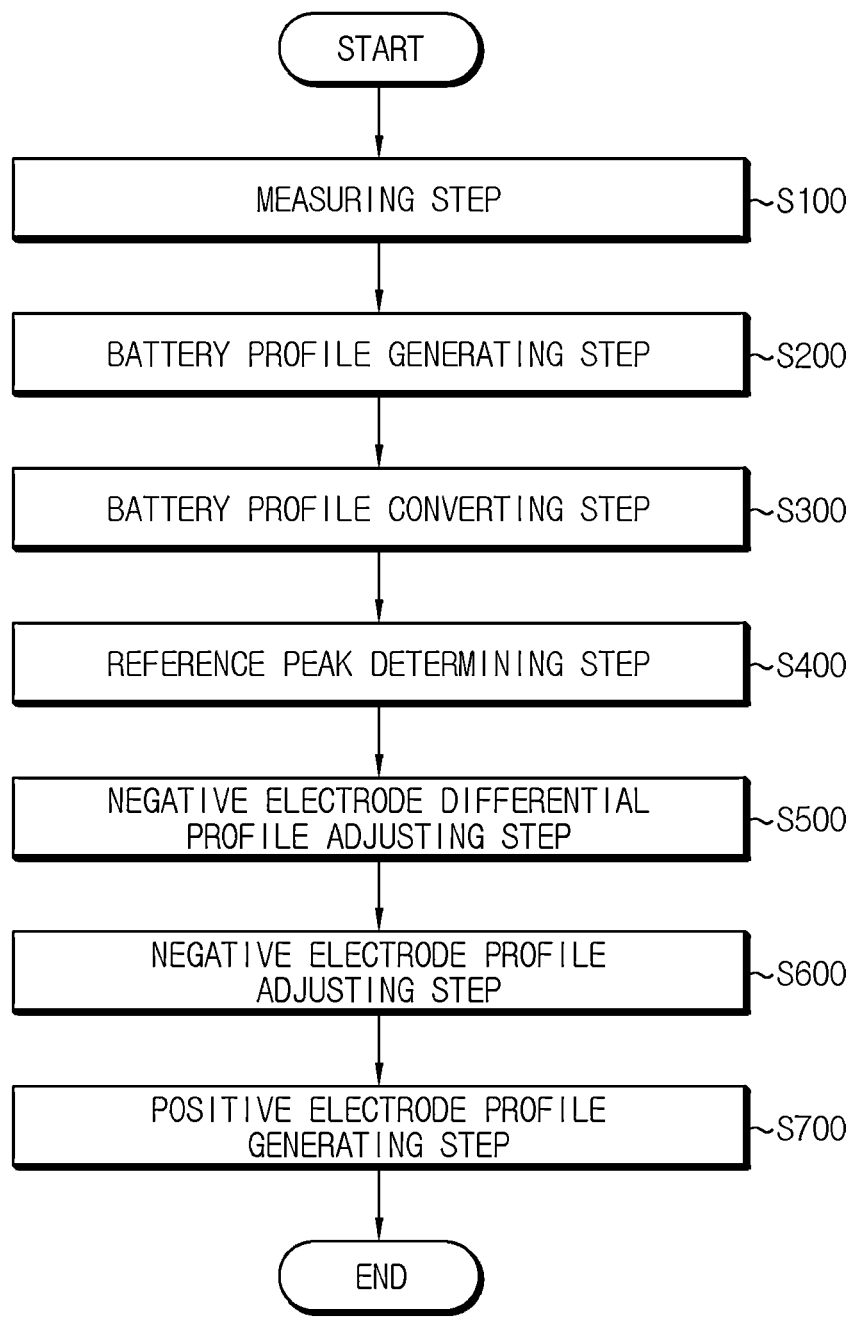
FIG. 8 is a diagram schematically showing a battery management method according to another embodiment of the present disclosure.

FIG. 8 is a diagram schematically showing a battery management method according to another embodiment of the present disclosure.

Each step of the battery management method may be performed by the battery management apparatus 100. Hereinafter, for convenience of description, it should be noted that the content overlapping with the previously described content will be briefly described or omitted.

Referring to FIG. 8, the battery management method according to another embodiment of the present disclosure may include a measuring step (S100), a battery profile generating step (S200), a battery profile converting step (S300), a reference peak determining step (S400), a negative electrode differential profile adjusting step (S500), a negative electrode profile adjusting step (S600), and a positive electrode profile generating step (S700).

The measuring step (S100) is a step of measuring the voltage and capacity of the battery cell B, and may be performed by the measuring unit 110.

For example, in the embodiment of FIG. 2, the measuring unit 110 may measure the voltage of the battery cell B using the first sensing line SL1 and the second sensing line SL2. Also, the measuring unit 110 may measure the current of the battery cell B using the third sensing line SL3, and may measure the capacity of the battery cell B based on the measurement time and the measured current.

The battery profile generating step (S200) is a step of generating a battery profile (Pb) representing the correspondence between a voltage value for the voltage measured in the measuring step (S100) and a capacity value for the capacity measured in the measuring step (S100), and may be performed by the profile generating unit 120.

For example, in the embodiment of FIG. 3, the profile generating unit 120 may receive the voltage value and the capacity value of the battery cell B from the measuring unit 110, and generate a battery profile (Pb) representing the correspondence between the voltage value and the capacity value corresponding to each other.

The battery profile converting step (S300) is a step of converting the battery profile (Pb) into a battery differential profile (Pb_d) representing the correspondence between the capacity value and a differential voltage value for the capacity value, and may be performed by the profile converting unit 130.

For example, referring to FIGS. 3 and 4, the profile converting unit 130 may convert the battery profile (Pb) of FIG. 3 generated by the profile generating unit 120 into the battery differential profile (Pb_d) of FIG. 4.

The reference peak determining step (S400) is a step of determining at least one reference peak in the battery differential profile (Pb_d), and may be performed by the control unit 140.

Specifically, the control unit 140 may determine a plurality of reference peaks in the battery differential profile (Pb_d).

For example, when the control unit 140 determines two reference peaks, the control unit 140 may determine the first reference peak (RP1) in the first capacity region of the battery differential profile (Pb_d) and determine the second reference peak (RP2) in the second capacity region.

The negative electrode differential profile adjusting step (S500) is a step of adjusting the negative electrode differential profile (Pa_d1) so that at least one target peak preset for the negative electrode differential profile (Pa_d1) of the battery cell B provided in advance corresponds to the determined reference peak, and may be performed by the control unit 140.

Referring to FIGS. 5 and 7, the control unit 140 may generate the adjusted negative electrode differential profile (Pa_d2) of FIG. 7 by adjusting the first target peak (TP1) and the second target peak (TP2) included in the negative electrode differential profile (Pa_d1) of FIG. 5 to correspond to the first reference peak (RP1) and the second reference peak (RP2), respectively. That is, the capacity value of the first target peak (TP1) may be changed from b1 [mAh] to a1 [mAh], and the capacity value of the second target peak (TP2) may be changed from b2 [mAh] to a2 [mAh]. In addition, the maximum capacity value of the adjusted negative electrode differential profile (Pa_d2) may be max2 [mAh]. Here, assuming that a1 [mAh] and b1 [mAh] are different and a2 [mAh] and b2 [mAh] are different, max1 [mAh] and max2 [mAh] may also be different values.

The negative electrode profile adjusting step (S600) is a step of adjusting the negative electrode profile (Pa1) of the battery cell B provided in advance to correspond to the adjusted negative electrode differential profile (Pa_d2), and may be performed by the control unit 140.

The control unit 140 may adjust the negative electrode profile (Pa1) to correspond to the adjusted negative electrode differential profile (Pa_d2) by applying the offset change information and the scale change information of the adjusted negative electrode differential profile (Pa_d2) to the negative electrode profile (Pa1). Through this, it is possible to generate the adjusted negative electrode profile (Pa2) corresponding to the negative electrode differential profile (Pa_d2).

The positive electrode profile generating step (S700) is a step of generating a positive electrode profile (Pc) of the battery cell B based on the adjusted negative electrode profile (Pa2) and the battery profile (Pb), and may be performed by the control unit 140.

The control unit 140 may generate the positive electrode profile (Pc) by adding voltage values for the same capacity value of the battery profile (Pb) and the adjusted negative electrode profile (Pa2).

In other words, the battery management method according to another embodiment of the present disclosure may obtain the adjusted negative electrode profile (Pa2) and the positive electrode profile (Pc) for the current state of the battery cell B based on the battery profile (Pb) without disassembling the battery cell B. Therefore, according to the battery management method, since the battery profile (Pb), the adjusted negative electrode profile (Pa2), and the positive electrode profile (Pc) may be all provided, various analysis data for the battery cell B may be provided.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery pack
100: battery management apparatus
110: measuring unit
120: profile generating unit
130: profile converting unit
140: control unit
150: storage unit
200: charging and discharging unit
B: battery cell

What is claimed is:

1. A battery management apparatus, comprising:
a measuring circuit configured to measure voltage and capacity of a battery cell;
a profile generator configured to receive a voltage value for the measured voltage and a capacity value for the measured capacity from the measuring circuit and to generate a battery profile representing a correspondence between the voltage value and the capacity value;
a profile converter configured to receive the battery profile from the profile generator and to convert the received battery profile into a battery differential profile representing a correspondence between the capacity value and a differential voltage value for the capacity value; and
a controller configured to:
determine at least one reference peak in the battery differential profile,
have a negative electrode profile and a negative electrode differential profile preset for a negative electrode of the battery cell,
adjust the negative electrode differential profile so that at least one target peak preset for the negative electrode differential profile corresponds to the determined reference peak,
adjust the negative electrode profile to correspond to the adjusted negative electrode differential profile, and
generate a positive electrode profile of the battery cell based on the adjusted negative electrode profile and the battery profile.

2. The battery management apparatus according to claim 1,
wherein the controller is further configured to determine a plurality of reference peaks in the battery differential profile and to adjust the negative electrode differential profile to be the same as a capacity value of a reference peak, among the plurality of reference peaks, to which capacity values of a plurality of target peaks preset in the negative electrode differential profile correspond.

3. The battery management apparatus according to claim 2,
wherein the controller is further configured to adjust the negative electrode differential profile while changing an offset corresponding to a minimum capacity value of the negative electrode differential profile and a scale representing an entire capacity region of the negative electrode differential profile.

4. The battery management apparatus according to claim 3,
wherein the controller is further configured to adjust the negative electrode profile to correspond to the adjusted negative electrode differential profile by applying change information of the offset and the scale for the adjusted negative electrode differential profile to the negative electrode profile.

5. The battery management apparatus according to claim 1,
wherein the controller is further configured to generate the positive electrode profile by adding the voltage value of the battery profile and the voltage value of the adjusted negative electrode profile for each identical capacity value.

6. The battery management apparatus according to claim 1,
wherein the controller is further configured to select a first capacity region and a second capacity region in an entire capacity region of the battery profile, to determine a first reference peak in the first capacity region of the battery profile, and to determine a second reference peak in the second capacity region of the battery profile.

7. The battery management apparatus according to claim 6,
wherein the controller is further configured to determine:
a peak at which an instantaneous change rate of the differential voltage value for the capacity value in the first capacity region of the battery profile is 0 and whose differential voltage value is greatest as the first reference peak, and
a peak at which an instantaneous change rate of the differential voltage value for the capacity value in the second capacity region of the battery profile is 0 and whose differential voltage value is greatest as the second reference peak.

8. The battery management apparatus according to claim 1,
wherein the negative electrode profile is a profile preset to represent a correspondence between the capacity value and a negative electrode voltage value of the battery cell, and
wherein the negative electrode differential profile is a profile preset to represent a correspondence between the capacity value and a differential negative electrode voltage value of the negative electrode voltage value for the capacity value.

9. A battery pack, comprising the battery management apparatus according to claim 1.

10. A battery management method, comprising:
measuring voltage and capacity of a battery cell;
generating a battery profile representing a correspondence between a voltage value for the measured voltage and a capacity value for the measured capacity;
converting the battery profile into a battery differential profile representing a correspondence between the capacity value and a differential voltage value for the capacity value;
determining at least one reference peak in the battery differential profile;
adjusting a negative electrode differential profile so that at least one target peak preset for the negative electrode differential profile of the battery cell provided in advance corresponds to the determined reference peak;
adjusting a negative electrode profile of the battery cell provided in advance to correspond to the adjusted negative electrode differential profile; and
generating a positive electrode profile of the battery cell based on the adjusted negative electrode profile and the battery profile.

11. The battery management method according to claim 10, wherein:
the determining of at least one reference peak includes determining a plurality of reference peaks in the battery differential profile, and
the adjusting of the negative electrode differential profile includes adjusting the negative electrode differential profile to be the same as a capacity value of a reference peak, among the plurality of reference peaks, to which capacity values of a plurality of target peaks preset in the negative electrode differential profile correspond.

12. The battery management method according to claim 11,
wherein the adjusting of the negative electrode differential profile includes adjusting the negative electrode differential profile while changing an offset corresponding to a minimum capacity value of the negative electrode differential profile and a scale representing an entire capacity region of the negative electrode differential profile.

13. The battery management method according to claim 12,
wherein the adjusting of the negative electrode profile includes adjusting the negative electrode profile to correspond to the adjusted negative electrode differential profile by applying change information of the offset and the scale for the adjusted negative electrode differential profile to the negative electrode profile.

14. The battery management method according to claim 10,
wherein the generating of the positive electrode profile includes generating the positive electrode profile by adding the voltage value of the battery profile and the voltage value of the adjusted negative electrode profile for each identical capacity value.

15. The battery management method according to claim 10, wherein the determining of at least one reference peak includes:
selecting a first capacity region and a second capacity region in an entire capacity region of the battery profile,
determining a first reference peak in the first capacity region of the battery profile, and
determining a second reference peak in the second capacity region of the battery profile.

16. The battery management method according to claim 15, wherein:
the determining of the first reference peak includes determining a peak at which an instantaneous change rate of the differential voltage value for the capacity value in the first capacity region of the battery profile is 0 and whose differential voltage value is greatest as the first reference peak, and
the determining of the second reference peak includes determining a peak at which an instantaneous change rate of the differential voltage value for the capacity value in the second capacity region of the battery profile is 0 and whose differential voltage value is greatest as the second reference peak.

17. The battery management method according to claim 10,
wherein the negative electrode profile is a profile preset to represent a correspondence between the capacity value and a negative electrode voltage value of the battery cell, and
wherein the negative electrode differential profile is a profile preset to represent a correspondence between the capacity value and a differential negative electrode voltage value of the negative electrode voltage value for the capacity value.

* * * * *